United States Patent [19]

Livingston

[11] 4,159,441

[45] Jun. 26, 1979

[54] SHIELDING AND RETAINING SYSTEM FOR VEHICLE ENGINE ELECTRICAL COMPONENTS

[75] Inventor: Russell G. Livingston, Redding, Calif.

[73] Assignee: Livingston Industries Incorporated, Redding, Calif.

[21] Appl. No.: 856,125

[22] Filed: Nov. 30, 1977

[51] Int. Cl.[2] .................... H01J 5/02; H01F 15/04; H05K 9/00; H01T 13/02

[52] U.S. Cl. .................................. 315/85; 313/134; 336/84 C; 339/26; 339/143 S; 174/35 SM; 123/148 P; 200/19 WG; 200/19 DC

[58] Field of Search ...................... 315/85; 313/134; 174/355 M; 123/148 P; 336/84 C, 84 R, 84 M; 200/19 DC, 19 WG, 305, 304; 339/143 R, 143 S, 26, 27, 89 C

[56] References Cited

U.S. PATENT DOCUMENTS

| | | | |
|---|---|---|---|
| 1,706,764 | 3/1929 | Wright | 200/19 WG |
| 2,253,531 | 8/1941 | Peters et al. | 315/85 |
| 2,409,732 | 10/1946 | Browne et al. | 313/134 X |
| 2,418,531 | 4/1947 | Tognola | 336/84 C |
| 3,048,704 | 8/1962 | Estes | 123/148 P X |
| 3,697,796 | 10/1972 | Livingston | 313/134 |

*Primary Examiner*—Alfred E. Smith
*Assistant Examiner*—Charles F. Roberts
*Attorney, Agent, or Firm*—Robert J. Schaap

[57] ABSTRACT

A shielding and retaining system for vehicle engine electrical components, and particularly, components forming part of the ignition system thereof such as the spark plugs, ignition coil and distributor. The spark plug, when located in the engine block, is shielded by means of a spark plug shield. In addition, the distributor is provided with a body enclosure which is disposed around the distributor and is secured thereto thereby providing electrical shielding around the distributor. In like manner, a separate body enclosure is provided to be fitted around the coil and which also prevents radio frequency signals emanating from the coil. With a minimum amount of shielding components, it is possible to reduce a substantial portion of radio frequency noise.

22 Claims, 16 Drawing Figures

SHIELDING AND RETAINING SYSTEM FOR VEHICLE ENGINE ELECTRICAL COMPONENTS

BACKGROUND OF THE INVENTION

1. Purpose of the Invention

This invention relates in general to certain new and useful improvements in shielding devices for ignition system components used in hydrocarbon combustion engines, and, more particularly, to shielding devices for use with spark plugs, coil and distributor associated with an engine forming part of the vehicle.

2. Brief Description of the Prior Art

Hydrocarbon combustion engines which employ spark ignition systems and components in the ignition system such as a distributor and coil for generating a spark in a combustion chamber result in the production of radio frequency signals emanating from the ignition system. In addition, the arcing of spark plugs and the other components in an ignition system and the potential for arcing in other portions of an electrical system forming part of an internal combustion engine generate substantial electrical noise. Various shielding devices have been proposed for use about the spark plugs and other components of the ignition system. In military-type vehicles and other apparatus where radio equipment must be operated and in other vehicles and apparatus where radio frequency interference is undesirable, shielding jackets have also been used around ignition wiring harnesses.

While a spark plug may be encased in a permanent shield to obviate these problems, the permanent shielding is quite expensive and, therefore, economically undesirable. This is particularly true since the spark plug is often replaced with the result that the shielding is also replaced.

The prior art is exemplified by my prior U.S. Pat. No. 3,697,796, granted Oct. 10, 1972, for SPARK PLUG SHIELDING. As shown in my prior patent, the spark plug is enclosed in a shield or enclosure which is connected to the plug and provides a wrench section for enabling the plug to be screwed into the block of an engine, the shield also providing a connector means for a shielded spark plug wire.

My copending application Ser. No. 847,124 filed Oct. 31, 1977, also discloses a shielding system for oriented spark plugs. This shielding is used with more sophisticated engines and turbines where it has become the practice to positively orient the spark plugs in the block or head so that the electrodes of the spark plug are positively oriented in the combustion chamber. Orientation of the new type spark plugs is accomplished by the provision of complemented key and keyway means in and on the block and spark plug. In such an assembly, separate means must be employed to clamp the spark plug in place in the socket in the engine. The typical clamping devices, however, interfere with the use of effective radio frequency shielding.

Applicant is aware that relatively expensive shielding devices have been used in connection with spark plugs, coils and distributors of vehicle electrical systems. Applicant knows of no previous system which employs relatively simple shielding devices for the distributor and the coil and which operates in conjunction with a relatively simple spark plug shield for substantially reducing the greatest portion of radio frequency signal emanation from the ignition system of a vehicle.

OBJECTS OF THE INVENTION

It is, therefore, the primary object of the present invention to provide a shielding system which permits effective retaining and shielding of components of an engine vehicle ignition system and provides for the enclosure of such components, thereby reducing the radiation of radio frequency signals.

It is another object of the present invention to provide a system of the type stated which includes a uniquely designed shield for ignition coils capable of retaining the ignition coil in a locked position with respect to the engine block and also prevents emission of radio frequency signals.

It is a further object of the present invention to provide a system of the type stated which provides for an enclosure of the distributor, thereby reducing the possibility of radio frequency signal emanation from the distributor.

It is also an object of the present invention to provide a spark plug shielding and retaining device forming part of the system of the present invention and also reduces the possibility of radio frequency signal emanation.

It is an additional object of the present invention to provide a system of the type stated in which the components thereof are easily installed and are easily shifted in order to permit servicing of the vehicle engine.

It is yet another object of the present invention to provide a shielding and retaining system of the type stated in which the components are durable in their construction and relatively economical to manufacture.

With the above and other objects in view, my invention resides in the novel features of form, construction, arrangement and combination of parts presently described and pointed out in the claims.

SUMMARY OF THE DISCLOSURE

A shielding and retaining system for vehicle engine electrical components. Particularly, the shielding system is adapted for shielding components of the ignition system of a vehicle where the ignition system includes at least an ignition coil, a distributor and one or more spark plugs.

The shielding system generally comprises a first shield, such as an ignition coil shield, which is capable of being disposed over the ignition coil of a vehicle and encloses at least the terminal end of the coil within the shield and holds the body of the coil against an engine portion of the vehicle. The system also includes a second shield, such as a distributor shield, capable of being disposed over a distributor shield on the distributor. In this way, the shield prevents emanation of undesirable electrical frequencies, such as radio frequencies. The system further includes a spark plug shield capable of being disposed about a spark plug. The shield has a body which is designed to retentively, but nevertheless removably, hold the spark plug.

In a preferred aspect of the invention, the coil shield is capable of being mounted on the top plate of the distributor shield and is capable of retentively holding the coil within the coil shield and against the top plate of the distributor shield when the distributor shield is secured to the distributor body.

The spark plug shield of the present invention is also unique in that it comprises an elongate hollow body which is open at each of the opposite ends thereof. An internal shoulder is formed within the body and faces the first open end of the body. This internal shoulder is designed to engage an enlarged multisided nut on the body of the spark plug. In this way, the shoulder forms a first retaining means. The body also includes an inwardly struck flange having an undulant and symmetrical configuration at the first end. In essence, this flange is comprised of a plurality of circumferentially spaced projections which are separated by intermediate areas. in this way, the projections can engage a surface on the nut portion in one orientation and hold the spark plug within the body. However, rotation of the shield with respect to the nut portion will permit the nut portion to pass between projections of the flange when in this rotated orientation.

The nut portion typically has a plurality of wrenching flats on a side thereof, and the surface which faces the first open end of the shield body provides a shoulder which is capable of engaging the inwardly struck flange. A spring means extends between the internal shoulder and the flange end. In this case, the spring means has a size to seat against the nut portion.

In a preferred aspect, the spark plug shield could include an insulating sheath therewithin. The insulating sheath would be sealingly engageable with an ignition wire connected to a terminal on the body of the spark plug.

The ignition coil shield is also unique in that it is provided with a housing having an enclosing side wall and a top wall extending thereacross to thereby form an internal chamber. An opening is formed in a first side wall portion in order to receive the head end of an ignition coil inside an internal chamber with at least one conductive element extending from the head end of the coil. Generally, in the preferred aspect, the side wall is a rectangularly shaped side wall having a pair of longitudinal walls and a pair of transverse walls. In this case, one of the transverse side walls is provided with the opening and which extends from the complete open bottom portion of the housing upwardly for a distance sized to receive the body portion of a conventional ignition coil.

The housing is provided with a conductive terminal which extends outwardly from one of the walls of the housing, and preferably the top wall. This conductive terminal also extends into the internal chamber. The housing is also provided with means for electrically connecting an end of such conductive terminal in the chamber to the conductive element on the head end of the ignition coil. In the preferred aspect, the ignition coil is usually provided with at least a pair of conductive elements on the enlarged head end, and these conductive elements would be connected to a pair of conductive terminals on the housing.

The housing is provided with a pair of circuit element chambers and at least one of the circuit element chambers is provided with an electrical filter means which is retentively held therein, preferably by a hardenable plastic such as an epoxy. The conductive terminal is connected to one terminal element on the filter means, and the other terminal of the filter means is capable of being connected to the conductive element on the head end of the coil.

The distributor shield is unique in that it is provided for enclosing a portion of the distributor and a portion of the conductive wires extending outwardly from the cap of the distributor to prevent emanation of the undesirable electrical frequencies. In this case, the distributor shield comprises a housing which has an enclosing side wall and a top wall extending across the enclosing side wall and thereby forms an internal chamber. The distributor shield is capable of fitting over a portion of the distributor including at least the distributor cap. A first connecting means is secured to the housing and extends to a reduced neck portion of the distributor where the reduced neck portion extends into the engine block. In this case, the connecting means is preferably a plurality of resilient straps and typically resilient clamp-type straps. The straps are secured to the housing and have terminal ends which engage the reduced neck portion of the distributor.

A clamp is also provided to extend around these straps. This clamp may adopt the form of a conventional hose-like clamp and will clamp the straps against the reduced neck portion of the distributor. In this way, radio frequency is grounded through the engine block and thereby reduces signal emanation beyond the housing.

A very substantial portion of the radio frequency signal noise arising from a vehicle ignition system is generated by the coil, the distributor and the spark plugs of the ignition system, and Applicant has found that it is possible to significantly reduce the radio frequency noise with only the three types of shields. These shields are relatively simple in their construction and thus can be manufactured at a relatively low cost, but are nevertheless quite effective for their intended purposes. The brevity of the system allows easy repair of maintenance of the vehicle without substantial component disassembly as is required in prior art shielding systems.

It was heretofore believed that it was necessary to shield substantially all of the components of an ignition system of a vehicle in order to substantially reduce or eliminate undesirable radio frequency signal noise. However, as indicated above, the applicant herein has found that it is possible to reduce a very substantial percentage of this undesirable radio frequency signal noise by merely enclosing the distributor, the spark plugs and the coil of the vehicle. Moreover, it is not necessary to shield the electrical ignition cable as previously assumed. The applicant has found that it is possible to produce highly effective results with relatively simple shields of the type previously described and as described in more detail hereinafter.

The shielding system of the present invention is relatively inexpensive to manufacture as a result of the relatively small number of components and the relatively simple construction thereof. In addition, the components are so uniquely designed that they can be easily installed in a relatively small amount of time, thereby obviating the need for someone skilled in the art of installing electrical shielding equipment. In addition, the shielding devices are easily removed or otherwise are mounted in a position where they can be easily swung into another position so that maintenance of the vehicle is easily afforded without a rather extensive disassembly often required in the prior art shielding systems.

This invention possesses many other advantages and has other purposes which may be made more clearly apparent from a consideration of forms in which it may be embodied. These forms are shown in the drawings accompanying and forming part of the present specification. They will now be described in detail, for the purposes of illustrating the general principles of the invention; but it is to be understood that such detailed descriptions are not to be taken in a limiting sense.

BRIEF DESCRIPTION OF THE DRAWINGS

Figure 1:
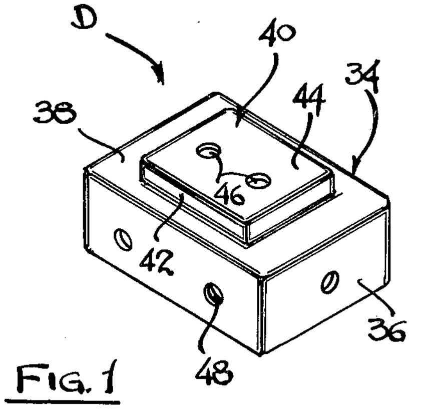
Figure 2:
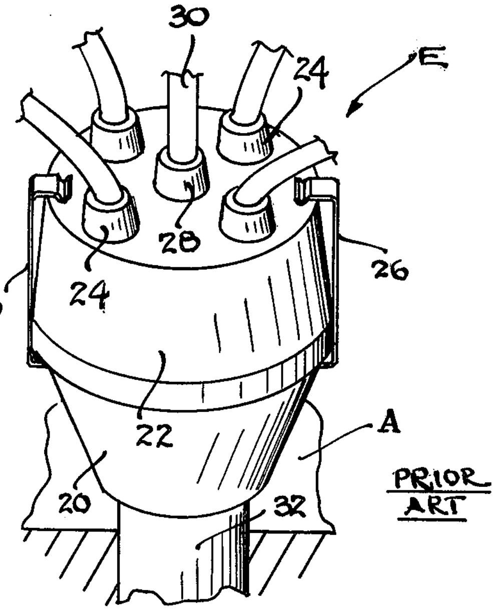
PRIOR ART FIG. 2
Figure 3:
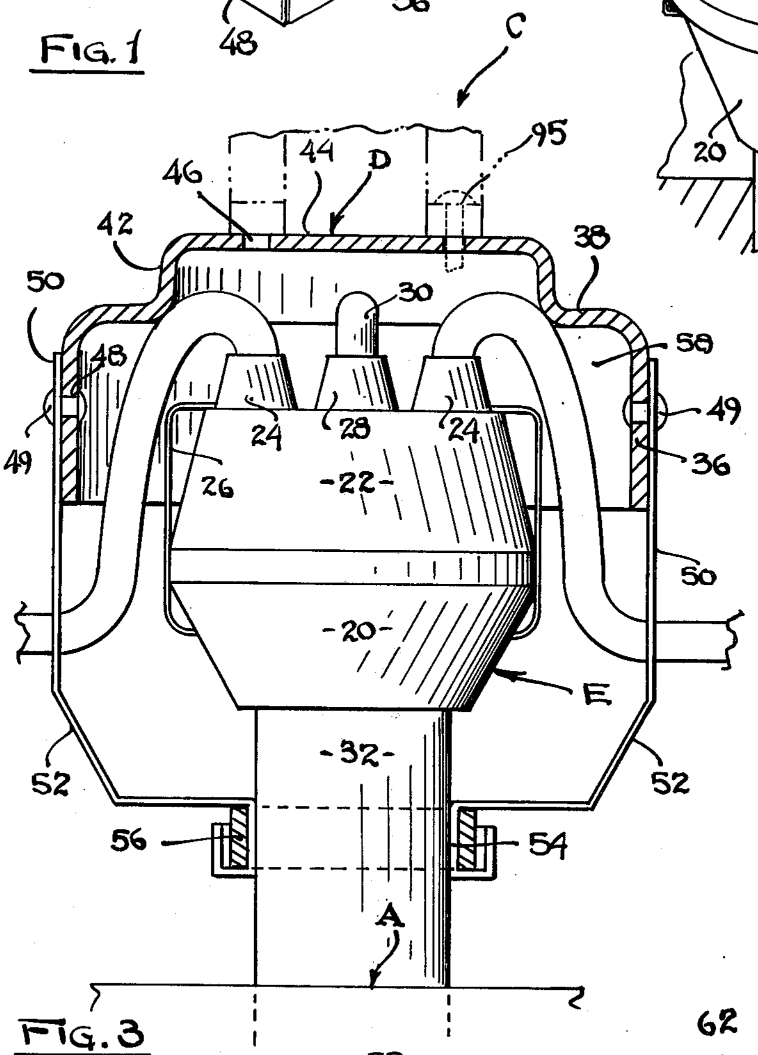
Figure 8:
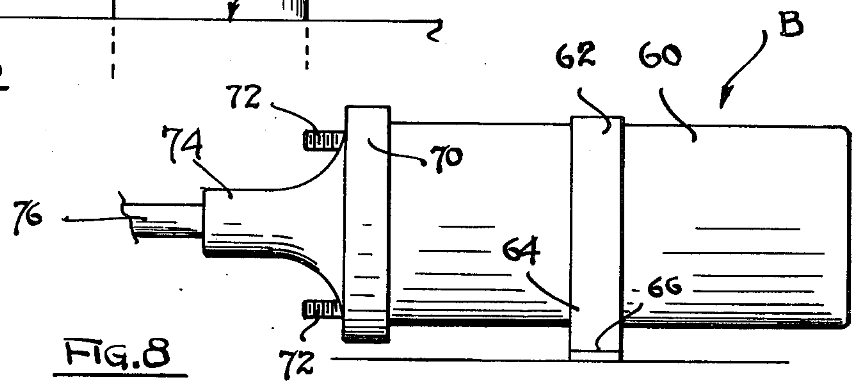
PRIOR ART FIG. 8
Figure 4:
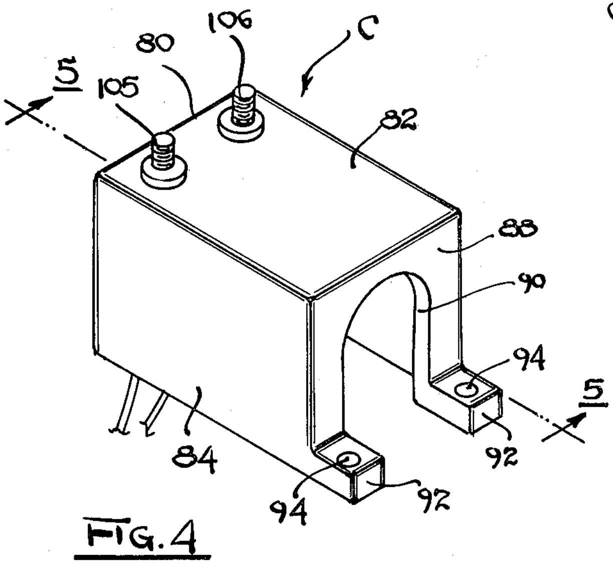
Figure 5:
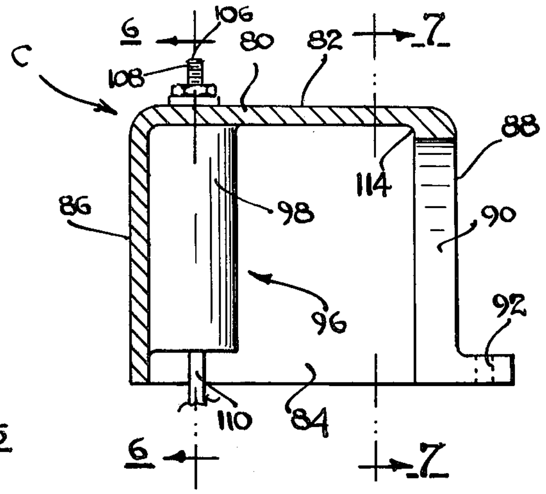
Figure 6:
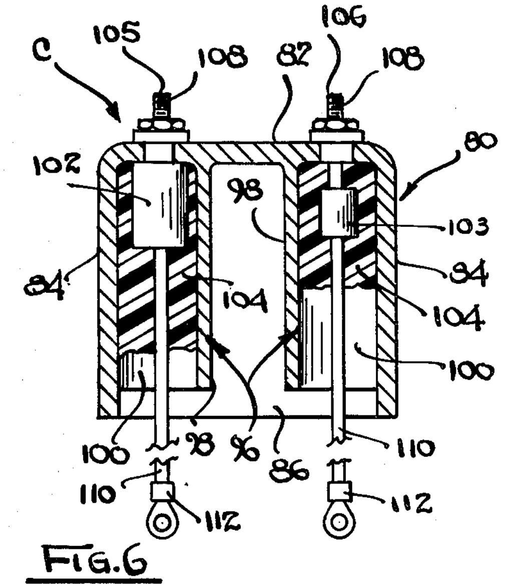
Figure 7:
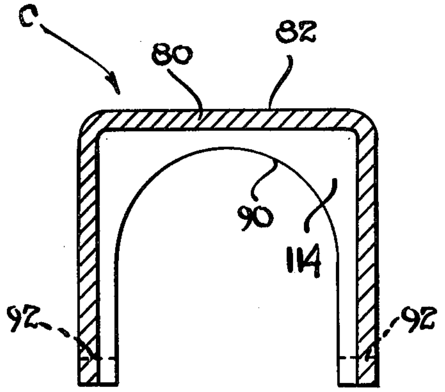
Figure 9:
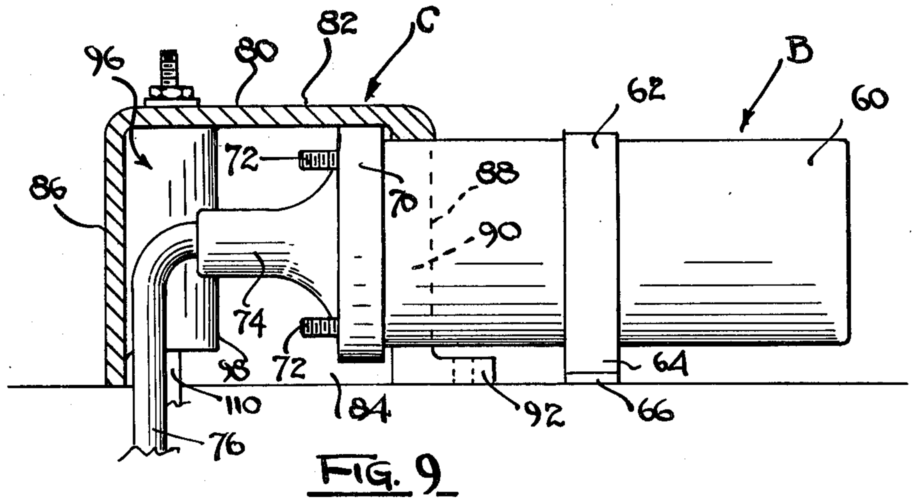
Figure 10:
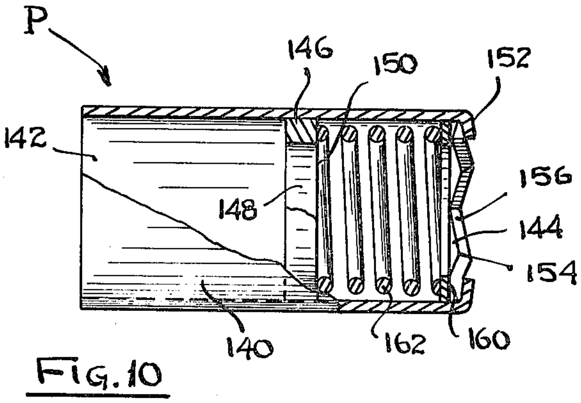
Figure 11:
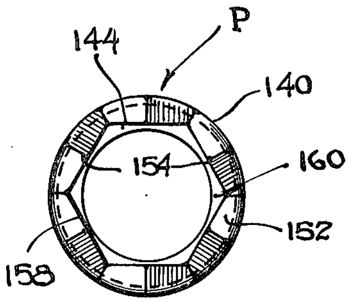
Figure 12:
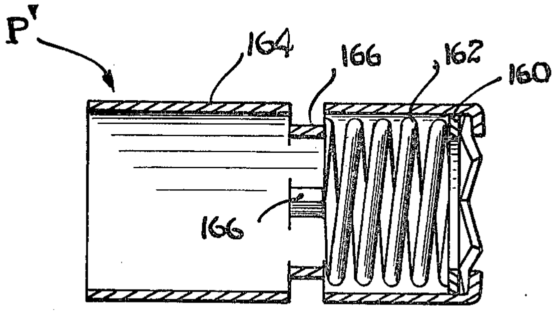
Figure 15:
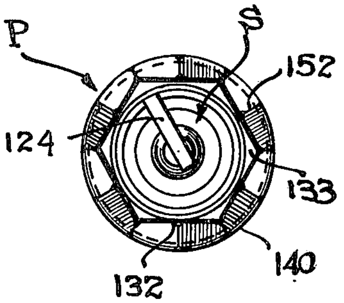
Figure 13:
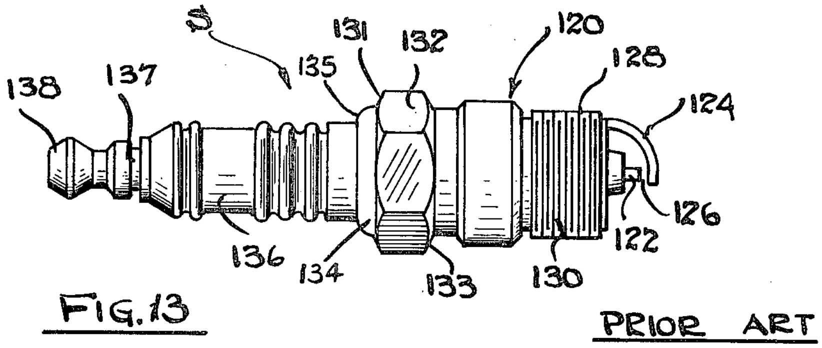
FIG. 13 PRIOR ART
Figure 14:
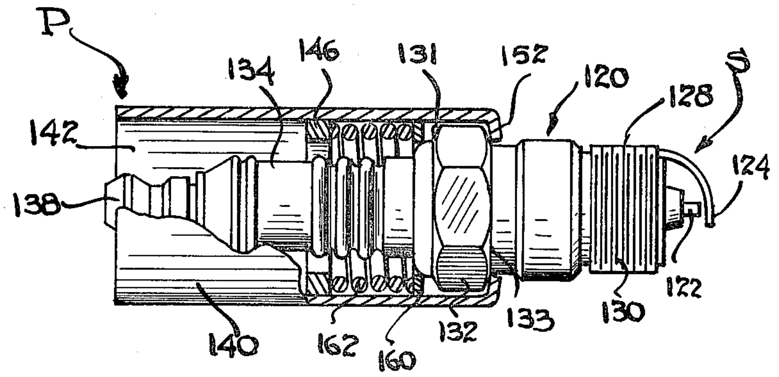
Figure 16:
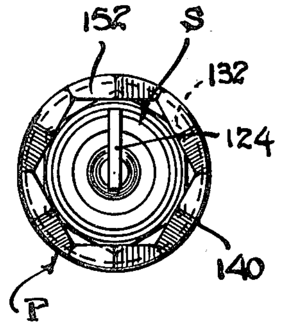

Having thus described the invention in general terms, reference will now be made to the accompanying drawings in which:

FIG. 1 is a perspective view of a shielding and retaining device used in conjunction with distributors forming part of a hydrocarbon combustion engine;

FIG. 2 is a view of a distributor with the distributor cap thereon in a conventional construction;

FIG. 3 is a vertical sectional view showing the use of the shielding and retaining device of FIG. 1 on the distributor of FIG. 2;

FIG. 4 is a perspective view of a shielding and retaining device used in conjunction with a conventional coil forming part of a hydrocarbon combustion engine;

FIG. 5 is a vertical sectional view, taken along line 5—5 of FIG. 4, and showing the interior portion of the shielding and retaining device thereof;

FIG. 6 is a vertical sectional view, taken along line 6—6 of FIG. 5, and showing one end portion of the shielding and retaining device of FIG. 4;

FIG. 7 is a vertical sectional view, taken along line 7—7 of FIG. 5 and showing the other end of the shielding and retaining device of FIG. 4;

FIG. 8 is a side elevational view of a coil used in the ignition system of a hydrocarbon combustion engine and which constitutes a prior art ignition coil;

FIG. 9 is a fragmentary vertical sectional view showing the coil of FIG. 8 retained and shielded by the retaining and shielding device of FIGS. 4–7;

FIG. 10 is a vertical sectional view showing a spark plug shield and retaining device used with the system of the present invention;

FIG. 11 is an end elevational view of the right-hand end of the spark plug shielding and retaining device of FIG. 10;

FIG. 12 is a vertical sectional view of a modified form of spark plug shielding and retaining device;

FIG. 13 is a side-elevational view of a conventional spark plug which is used with the shielding and retaining device of FIGS. 10–12;

FIG. 14 is a vertical sectional view showing the conventional spark plug of FIG. 13 being retained and shielded by the retaining and shielding device of FIGS. 10–12;

FIG. 15 is an end elevational view showing the orientation of a spark plug for insertion and removal with respect to the spark plug shield of FIGS. 10 and 12; and FIG. 16 is an end elevational view, similar to FIG. 15, and showing the orientation of the spark plug when locked in the shield.

DETAILED DESCRIPTION OF THE PREFERRED EMBODIMENTS

Referring now in more detail and by reference characters to the drawings which illustrate practical embodiments of the present invention, these drawings illustrate various components which are used to retain and shield electrical components of a vehicle ignition system. The primary components of the vehicle ignition system which generate radio frequency signals in largest amounts and which also provide the greatest potential for an explosive environment are the distributor, the coil and the spark plugs. In accordance with the present invention, a shielding and retaining device D is provided for the distributor, as illustrated in FIGS. 1–3 of the drawings; a shielding and retaining device C is provided for the coil, as illustrated in FIGS. 4–9 of the drawings, and a spark plug shielding and retaining device P is provided, as illustrated in FIGS. 9–14 of the drawings.

In this respect, it should be understood that the term "engine" as used herein denotes a hydrocarbon combustion engine, such as the conventional internal combustion engine, and is used in the generic sense to encompass turbines and other forms of engines which employ electrical ignition systems requiring the use of spark plugs. Moreover, it should also be understood that the wires connecting the various components which are retained and shielded by the system of the present invention are not required to be included within wire shields. However, the system of the present invention can be easily provided with the proper couplings to operate with shielded ignition wires.

Referring now to FIGS. 1 and 2 of the drawings, it can be observed that the retaining and shielding device D is used in connection with a conventional distributor E. The distributor is generally of a conventional type and is more fully illustrated in FIG. 2 of the drawings. In this case, the distributor includes a distributor body 20 having a distributor cap 22 retained thereon by means of conventional spring clamps 26. Moreover, the distributor cap 22 is provided with a plurality of upstanding posts 24, four as shown, which carry output wires to the various spark plugs P forming part of the engine vehicle.

In this case, the engine vehicle would be provided with four spark plugs for a four-cylinder engine. Nevertheless, it should be observed that the distributor E could be provided with a distributor cap 22 having six or eight posts 24 in order to cooperate with an engine having six or eight cylinders, whether a straight six or straight eight configuration, or a V-six or V-eight configuration. In addition, the distributor cap is provided with a hollow center post 28 having an ignition wire 30 which is connected to the ignition coil of the vehicle.

The distributor E is also provided with a lower tubular element 32 which extends into an engine vehicle block A and which carries a rotor shaft (not shown) located under the distributor cap 22 and thereby provides proper ignition signals through the various wires extending through the distributor posts 24.

The distributor shielding and retaining device D comprises an outer housing 34 having a rectangular side wall 36 with a top wall 38 integrally formed therewith. In addition, the device D is provided with an upwardly extending section 40 having a side wall 42 along with a top wall 44. The top wall 44 is provided with a plurality of apertures 46 for receiving the shielding and retaining device C, in a manner to be hereinafter described in more detail. In addition, the side wall 36 is provided with a plurality of apertures 48 for fastening to the engine block A or other portions of the engine vehicle. In this case, the apertures 48 are designed to receive conventional metallic fasteners 49, such as screws, bolts or the like.

It should be understood in this connection that the exact shape of the shielding and retaining device D as illustrated in FIGS. 1 and 3 of the drawings is not critical. The important criteria is that the shielding and retaining device C must be formed of a material capable of preventing emanation of radio frequency signals and also having structural integrity along with a capability of fitting over a conventional distributor cap along with the distributor, in the manner as illustrated in FIGS. 1-3 of the drawings.

Referring now to FIG. 3 of the drawings, it can be observed that the shielding and retaining device D is provided with a plurality of brackets 50 (two as shown) which are rigidly affixed to opposed side wall sections forming part of the vertical peripheral wall 36 of the shielding and retaining device D. These brackets 50 are referred to herein as spring clamps since they adopt the shape of the spring clamps used to secure a distributor cap. These brackets 50 may be affixed in the peripheral side wall 36 in any conventional manner such as by the fasteners 49, in a conventional construction. Moreover, the brackets 50 have angular inwardly extending sections 52 which merge into downwardly struck flanges 54 which engage the tubular element 32 in the manner as illustrated in FIG. 3. These inwardly struck elements 52 and/or the flanges 54 are engaged by a conventional clamp 56, such as a hose clamp, in order to retentively engage the tubular element 32.

The wires into and out of the distributor cap pass out of the housing 34 at the lower end of the side wall 42. The distributor is effectively shielded within the enclosure 58 formed by the shielding and retaining device D of the present invention through grounding against the tubular element 32 and the engine block of the vehicle. In many prior art devices, it was thought that fairly substantial enclosure of the ignition system component was required. Hence, wires passed through apertures in the housing, and this has now been found to be highly undesirable. In this way, the possibility of radio frequency signal emanation is substantially reduced.

The shielding and retaining device C which houses a portion of a conventional ignition coil B is more fully illustrated in FIGS. 4-7 of the drawings. A conventional ignition coil B is more fully illustrated in FIG. 8 of the drawings. It can be observed that the conventional ignition coil B comprises an outer cylindrical body 60 having a spring clamp 62 disposed therearound with a pair of depending flanges 64 for securement to the engine block or other portion of the engine system of the vehicle. In this case, the flanges 64 would be provided with terminal flaps 66 having apertures (not shown) for securing the ignition coil B to the body of the engine.

FIG. 8 essentially represents a prior art construction of a conventional ignition coil B and also includes an enlarged head section 70 on the cylindrical body 60. The head section 70 is provided with a pair of terminals 72 for connection to the ignition system of the vehicle on a conventional manner. In addition, the ignition coil B is provided with a hollow central post 74 carrying a central conductor 76 which is connected to the ignition portion of the vehicle in order to energize the coil and the remaining portions of the ignition system to operate the vehicle engine.

In accordance with the above description, it should be understood that the ignition coil B is only one form of conventional ignition coil, and other forms of conventional ignition coils could be used with the shield of the present invention. Moreover, the means for retaining the ignition coil B to the engine block, as for example, the spring clamp 62 is also conventional. Here again, other forms of means for retaining the ignition coil B to the engine block could also be provided.

The shielding and retaining device C generally comprises an outer housing 80 having a top wall 82 with integrally formed depending side walls 84 and a transversely extending back wall 86 connecting the side walls 84. In addition, the shield C is provided with a front wall 88 having an enlarged opening 90 in order to accommodate the coil B. Moreover, the front wall 88 is provided with a pair of transversely spaced apart longitudinally extending flange plates 92 which are provided with apertures 94 for receiving bolts 95 or other conventional fasteners for securement to the top wall 44 of the upwardly extending section 40. In this case, it can be observed that conventional fasteners such as screws or bolts would extend through the apertures 94 and into the apertures 46 for mounting the shielding and retaining device C to the upper surface of the shielding and retaining device D in the manner as illustrated in phantom lines in FIG. 3.

Again, and with respect to the present invention, it should be understood that the shielding and retaining device is essentially formed of a rectangularly shaped housing, although it could be modified in order to accommodate other forms of ignition coils. Even moreso, the shielding and retaining device could be modified to provide another aesthetic appearance. Nevertheless, the shielding and retaining device C is formed of a metallic material capable of preventing emanation of radio frequency energy from the conventional ignition coil B when the ignition system of the vehicle is operated.

The shielding and retaining device C also comprises a pair of transversely spaced-apart vertically disposed solid-state circuit element receiving tubes 96. These receiving tubes are formed by a pair of vertically disposed transversely spaced apart metallic cylindrical elements 98 which abut against the top wall 82 and the back wall 86, in the manner as illustrated in FIGS. 5 and 6 of the drawings. It can be observed that the tubes 96 are provided with a hollow interior 100 in order to receive solid-state elements, as for example, capacitors 102 and 103. The capacitors 102 and 103 are retained within the recesses 100 by means of a suitable adhesive material, such as a hardenable epoxy resin 104 or the like. It can be observed that in the case of the present invention, a pair of spaced-apart capacitors 102 and 103 are located in each of the recesses 100, although in many embodiments of the present invention only one such capacitor is required.

An inductive device, as for example, a coil could be used in place of the capacitor 103. Otherwise, the combination of a capacitive device and an inductive device could be used in place of the capacitor 103. In many cases, the element or elements used in place of the capacitor 103 or the capacitor 103 itself, would function as an electrical filter. This is primarily desirable when the ignition system is an electronic ignition.

The capacitor 102 is provided with or connected to an upstanding terminal 105 which extends beyond the top plate 82 of the body 80 and, in addition, the body 80 is provided with another terminal 106 which also extends through the top plate 82. In the embodiment as illustrated, the terminal 106 is also connected to a similar capacitor 102, although as indicated above, only one such capacitor 102 may be required. In each case, the terminals 105 and 106 are provided with threaded upper ends 108 in order to receive a conventional ignition wire and retain the same thereon by means of conventional bolts or like fasteners (not shown).

The capacitor 102, or otherwise the pair of capacitors 102 and 103, or further, a capacitor 102 and an inductive device 103, are provided with depending conductors 110 which are provided with fittings 112 for attachment to the terminals 72 on the ignition coil B for ultimate connection to the ignition system of the vehicle, as for example, terminals on the distributor, or other portions of the automotive vehicle.

In the embodiment of the shield C as illustrated in FIGS. 4–7 of the drawings, it can be observed that one of the fittings 112 is connected to one of the terminals 72, and the other of the fittings 112 is connected to the other of the terminals 72 forming part of the coil B. Moreover, the lead 76 from the post 74 would be connected to the ignition system as previously described.

The interior surface of the casing front wall 88 provides an inwardly presented, somewhat U-shaped abutment shoulder 114 which is essentially of an inverted U-shape cross section. In this way, when the ignition coil B is inserted within the housing 80, the enlarged head 70 will engage the shoulder 112 when the coil B is disposed within the shielding and retaining device C. In this respect, the enlarged head 70 can be inserted within the shielding and retaining device C from the open bottom portion thereof and shifted upwardly so that the enlarged head 70 abuts against the shoulder 114. At this point, the terminals 72 on the coil B can be secured to the respective terminal fasteners 112. In like manner, the wire 76 from the post 74 can be connected to the ignition system through the underside of the housing 80.

When the shielding and retaining device C is mounted to the shielding and retaining device D by means of the conventional fasteners 95, the ignition coil B will be retained within the shielding and retaining device C in the manner as previously described. If desired, the flaps 66 on the spring clamp 62 can be secured to the top wall 44 of the shielding and retaining device D.

There is at least one fairly new ignition system which provides the coil and the distributor as somewhat of a single unit. Thus, the coil section is mounted somewhat centrally on the distributor cap. In this type of conventional ignition system, it should be understood that a single shielding device of the present invention would be used to cover the combination coil and distributor. This single shielding device would be a distributor shield with a fairly extended side wall portion. Thus, only this modified distributor shield would be required along with the spark plug shields, as hereinafter described.

The spark plug shielding device P is more fully illustrated in FIGS. 10–12 of the drawings, and a conventional spark plug is illustrated in FIG. 13 of the drawings. Moreover, the entire assembly of the shielding device P around the spark plug is more fully illustrated in FIG. 14 of the drawings.

Referring now to FIG. 13 of the drawings which illustrates a spark plug S, it can be observed that the spark plug S is of a conventional type and includes a base section 120 having a central electrode 122 and an outer electrode 124 forming a spark gap 126 therebetween. The base section 120 is connected to an attachment section 128 which fits within a conventional spark plug bore in the head of a vehicle engine block, and in this case is provided with external threads 130 thereon for mating with threads within the bore of the vehicle engine block. Thus, the base section 120 would be fitted within the vehicle engine block so that the electrodes 122 and 124 are located within the combustion chamber of the vehicle engine. The gap 126 is provided so that an arc can be created between the electrodes 122 and 124 to ignite a fuel charge in the combustion chamber forming part of the engine.

The conventional spark plug S is also provided with an enlarged section 131 in the form of a nut which may be provided with wrenching flats 132 of a conventional nature in order to threadedly secure the section 128 within the internally threaded spark plug receiving bore of the engine block. The nut as shown in this embodiment of the invention is a hexagonal (six-sided) nut. The enlarged section 131 forms a shoulder 133 surrounding the attachment section 128 facing the engine block to which the plug S would be mounted. Moreover, on the opposite side of the enlarged section 131 is a boss 134 of reduced radial dimension and having an arcuate peripherally extending engagement shoulder 135.

Extending outwardly from the boss 134 and the enlarged section 131 is a cylindrical body section 136 usually formed of an insulative material and which body section is often referred to as an insulator and further surrounds a central body conductor 137. A shoulder 135 is present on the opposite side of the enlarged section 131 surrounding the body conductor 137. The conductor 137 extends beyond the insulator 136 and terminates in an enlarged head 138 for attachment to another portion of the ignition system, as for example, a conductor from the distributor. The conductor 137 is typically connected to the central electrode or terminal 122 in an operative manner so as to create a spark in the gap 126.

The present invention provides the spark plug shielding device P which is designed to surround the spark plug S and shield against radio frequency energy emanating from the spark plug S. In this case, the spark plug shielding device P generally comprises a cylindrically shaped housing 140 having a first open end 142 which typically serves as an upper end and an open second end 144 which typically serves as a lower end when the spark plug is mounted in an upright position. Located within the housing is a first retaining means in the form of a retaining ring 146 having a central aperture 148 and which presents a shoulder 150 toward the engine block of the vehicle. The open end 144 is provided with an inwardly struck flange 152 having a symmetrical and undulant configuration, which serves as a second retaining means.

The flange 152 is constructed with a plurality of outwardly struck projections 154 (six as shown) with each being separated from the other by somewhat V-shaped recesses or valleys 156. The flange 152 is generally of thin walled construction and the projections 154 essentially serve as high points where the recesses 156 essentially serve as low points. In this way, the combination of the recesses and the projections provide an undulant but symmetrical configuration to the flange 152. When the flange 152 is bent into the desired configuration, the flange forms six relatively flat edges 158, with each edge 158 extending between a pair of valleys 156. The interior surface of the flange 152 along these edges 156 create lips to engage the spark plug S as hereinafter described.

A cylindrically shaped floating washer 160 is also located within the housing 140 and is biased axially away from the retaining ring 146 by means of a compression spring 162. This compression spring 162 bears against the shoulder 150 on the retaining ring 146 and on a flat surface of the floating washer 160. In this case, the floating washer 160 is also provided with an enlarged central aperture in order to accommodate the spark plug S in a manner to be hereinafter described.

FIG. 14 of the drawings more fully illustrates the retentive engagement of the spark plug S by the spark plug shield P. In this case, it can be observed that the shield P is disposed about a portion of the spark plug S which extends beyond the engine block. Thus, the in-turned flange 152 and particularly the interior surface of the projections 154 engage the shoulder 133 on the underside of the enlarged section 131 forming part of the spark plug S. In addition, it can be observed that the attachment section 128 and the base 120 extend beyond the open end 144. The remaining portion of the spark plug S, as for example, the enlarged section 131, the boss 134, and the insulating body section 136 with the central body conductor 137, are located within the shield P, as illustrated in FIG. 14 of the drawings. In the embodiment as illustrated, the shield P has a length so that substantially all of the spark plug S is located therein. However, it should be observed that the length of the shield body could be greater or less than that shown.

The spark plug S is initially inserted into the retaining and shielding device P through the open end 144 thereof with the enlarged head 138 being first inserted. The spark plug S is pushed into the device P with the floating washer 160 engaging the boss 134 of the spark plug S. The spark plug S is further pushed into the device P compressing the spring 162. When inserting the plug P, it is important that the plug is oriented so that the edges connecting each of the wrenching flats are located with the proper orientation, e.g. alignment, with the respective flat edges 158. In this way, the enlarged section 131 can pass through the flange 152. After the enlarged section is inserted within the device P, it is rotated slightly so that the flat edges 158 are no longer in alignment with edges connecting the wrenching flats 132 on the shoulder 133. Thus, the wrenching flats engage the interior lip portion of the flange 152. In this way, the flange 152 will retentively hold the spark plug S within the device P.

When it is desired to remove the plug S, the plug is rotated through a slight arc so that the edges connecting each of the wrenching flats 132 become aligned with the flat edges 158. In this way, the plug can be removed from the device P.

FIG. 12 illustrates a modified form of shielding and retaining device P′ which is similar in construction to the shielding and retaining device P. The shielding and retaining device P′ also includes an outer cylindrically shaped body 164 similar to the body 140. However, in place of the retaining ring 146, the outer body 164 includes a plurality of circumferentially spaced indentations 166. By reference to FIG. 12, it can be observed that the compression spring 162 biases against these indentations 166 and, hence, the outer body 164 forms a shielding and retaining device P′ which operates in the same manner as the shielding and retaining device P.

If desired, the shielding and retaining components of the present invention may be easily modified to receive a spark or explosion insulating sheath located around the interior surface thereof to prevent arcing between any portion of the vehicle electrical component and the metal shielding enclosure. This form of insulating sheath (not shown) is preferably provided of a molded fluoro-carbon. This fluoro-carbon molded sheath or other form of sheath would thus render an explosion-proof environment around the vehicle component.

Thus, there has been illustrated and described a unique and novel shielding and retaining system which provides a means for retaining and securing and shielding ignition system components, such as distributors, ignition coils and spark plugs, with respect to an engine block and which, therefore, fulfills all of the objects and advantages sought therefor. It should be understood that many changes, modifications, variations and other uses and applications will become apparent to those skilled in the art after considering this specification and the accompanying drawings. Therefore, any and all such changes, modifications, variations and other uses and applications which do not depart from the spirit and scope of the invention are deemed to be covered by the invention which is limited only by the following claims.

Having thus described my invention, what I desired to claim and secure by letters patent is:

1. A spark plug shield for use with a spark plug having a plug body with an enlarged multi-sided nut portion thereon and which nut portion includes wrenching flats on a side thereof and a shoulder thereon, said spark plug shield comprising an elongate hollow body having a first open end and a second open end opposite said first open end, an internal shoulder in said elongate hollow body facing the second open end of the body and facing the enlarged multi-sided nut portion on the body of the spark plug when said plug is located within said shield, the second open end of said body including an inwardly struck flange element having an undulant and symmetrical configuration and being engaged by said shoulder on the nut portion of said spark plug when the plug is located within the the spark plug shield, said flange element having edges conforming to edges on the multi-sided nut portion so that said edges engage a surface on said nut portion in one orientation and hold said spark plug in said body and permit said nut portion to pass through said second opening when in another orientation, said first open end of said body permitting connection of an ignition wire to said spark plug, and spring means engaging said internal shoulder and said flange element and extending therebetween when no plug is in the shield and extending between said internal shoulder and said nut portion biasing said shoulder of said nut portion into engagement with said flange element when a spark plug is located in said shield.

2. The spark plug shield as defined in claim 1 wherein said spring means has a diametral size less than said nut portion.

3. The spark plug shield as defined in claim 1, wherein said flange element is comprised of a plurality of circumferentially spaced projections separated by intermediate areas, and the distance between two intermediate areas defines an edge on the flange element.

4. A spark plug shield as defined in claim 1, wherein the number of edges and the size thereof on said flange element is equal to the number of edges and the size thereof on said nut-portion.

5. The spark plug shield of claim 3 wherein the projections are radially outwardly struck portions and said intermediate areas are radially inwardly depressed areas.

6. The spark plug shield of claim 1 wherein said spring means extends about the body of said spark plug when said plug is located within said shield.

7. An ignition coil shield comprising: a housing having an enclosing side wall with a top wall extending thereacross thereby forming an internal chamber in said housing, said side wall having an opening formed therein to receive the head end of an ignition coil in said internal chamber and said coil having at least one conductive element extending from said head end, means forming a circuit element chamber in said housing, a circuit element in said circuit chamber and being retentively held therein, a conductive terminal extending outwardly from one of the walls of said housing and into said circuit element chamber and being connected to a terminal on said circuit element, and means for electrically connecting said circuit element in said circuit element chamber to the conductive element on said head end.

8. The ignition coil shield as defined in claim 7 wherein a hardenable plastic retentively holds said circuit element in said circuit element chamber, and said circuit element is a filter.

9. The ignition coil shield as defined in claim 7 wherein mounting means extends outwardly from said side wall for securing said housing to a portion of a vehicle engine.

10. The ignition coil shield as defined in claim 9 wherein said mounting means comprises a pair of spaced-apart flanges having apertures to receive metallic-type fasteners.

11. The ignition coil shield as defined in claim 10 wherein said housing is opened on its lower end and said opening extends to and communicates with said opened lower end.

12. The ignition coil shield as defined in claim 7 wherein means forms a second circuit element chamber in said housing, a second circuit element in said second circuit element chamber and being retentively held therein, a second conductive terminal extending outwardly from said housing and being connected to one terminal element on said second circuit element, and said means for electrically connecting is adapted to electrically connect said second circuit element to another conductive element on said head end.

13. A shielding system for shielding only, including an ignition coil and a distributor and the spark plugs forming part of the ignition system of a vehicle, said shielding system comprising, a first shield capable of being disposed over a portion of an ignition coil and enclosing at least the head end of the coil within said shield, said first shield comprising a housing having an enclosing side wall with a top wall extending thereacross thereby forming an internal chamber, means forming an opening in a portion of said side wall to receive the head end of an ignition coil in said internal chamber with at least one conductive element extending from said head end, a conductive terminal extending outwardly from one of the walls of said housing and into said internal chamber, means for electrically connecting an end of said conductive terminal in said internal chamber to the conductive element on said head end, a second shield capable of being disposed over a distributor, and having means for retentively retaining said second shield on said distributor and grounding with respect to an engine vehicle to shield against emanation of undesirable electrical frequency, one or more third shields with an individual third shield being employed for each spark plug forming part of the ignition system of said vehicle, each said third shield having a body capable of being disposed about a spark plug, and first and second retaining means associated with each said third shield body to retentively but nevertheless removably hold a spark plug within said body.

14. The shielding system as defined in claim 13 wherein said first shield has mounting aperture means, said second shield is provided with a mounting element having an aperture therein capable of being aligned with the mounting aperture means of said first shield and capable of being mounted on said first shield by means of a fastener.

15. The first shield as defined in claim 14 wherein means forms a solid state circuit element chamber in said housing, a solid state circuit element in said circuit element chamber and being retentively held therein, said conductive terminal being connected to one terminal element, and said means for electrically connecting is connected to another terminal element on said solid state circuit element and is capable of being connected to said conductive element on said head end.

16. A distributor shield for enclosing a portion of a distributor and a portion of the conductive wires extending therefrom to prevent emanation of undesirable electrical frequencies, said shield comprising a housing having an enclosing side wall and a top wall extending thereacross and forming an internal chamber for fitting over a portion of a distributor, a plurality of resilient straps secured to said housing and having terminal portions extendable to and engageable against a reduced neck portion on said distributor extending to an engine block, and a clamp means extending around said terminal portions and clamping same against said reduced neck portion.

17. A shielding system for shielding an ignition coil and a distributor and the spark plugs forming part of the ignition system of a vehicle, said shielding system comprising, a first shield capable of being disposed over an ignition coil and enclosing at least the terminal end of the coil within said first shield, said first shield having mounting aperture means, a second shield capable of being disposed over a distributor and having means for retentively retaining said second shield on said distributor and grounding with respect to an engine vehicle to shield against emanation of undesirable electrical frequency, a mounting element on said second shield and having an aperture therein capable of being aligned with the mounting aperture means of said first shield for mounting said second shield to said first shield by means of a fastener, one or more third shields with an individual third shield being employed for each spark plug forming part of the ignition system of said vehicle, each said third shield having a body capable of being disposed about a spark plug, and first and second retaining means associated with each said third shield body to retentively but nevertheless removably hold a spark plug within said body.

18. A shielding system for shielding components, including an ignition coil and a distributor and the spark plugs forming part of the ignition system of a vehicle, said shielding system comprising, a first shield capable of being disposed over an ignition coil and enclosing at least the terminal end of the coil within said shield, a second shield comprising a housing having an enclosing side wall and a top wall extending thereacross forming an internal chamber for fitting over a portion of a distributor and having means for retentively retaining said second shield on said distributor and grounding with respect to an engine vehicle, said second shield having a size and shape to enclose a portion of a distributor and a portion of conductor wires extending from said distributor to prevent emanation of undesirable electrical frequencies and for grounding with respect to a vehicle engine, a plurality of resilient straps secured to said housing of said second shield and having terminal portions engageable against a reduced neck portion on said distributor, and said hose-like clamp means extending around said terminal portions of said straps and clamping same against said reduced neck portion, one or more third shields with an individual third shield being employed for each spark plug forming part of the ignition system of said vehicle, each said third shield having a body capable of being disposed about a spark plug, and first and second retaining means associated with each said third shield body to retentively but nevertheless removably hold a spark plug within said body.

19. A distributor shield for enclosing a portion of a distributor and a portion of the conductive wires extending therefrom to prevent emanation of undesirable electrical frequencies, said shield comprising a housing having an enclosing side wall and a top wall extending thereacross and forming an internal chamber for fitting over a portion of a distributor, a plurality of resilient straps secured to said housing and having terminal portions extendable to and engageable against a reduced neck portion on said distributor extending to an engine block, and a hose-like clamp means extending around said terminal portions and clamping same against said reduced neck portion.

20. A shielding system for shielding only, including an ignition coil and a distributor and the spark plugs forming part of the ignition system of a vehicle, said shielding system comprising, a first shield capable of being disposed over an ignition coil and enclosing at least the terminal end of the coil within said shield, a second shield capable of being disposed over a distributor and having means for retentively mounting said second shield on said distributor and grounding with respect to an engine vehicle to shield against emanation of undesirable electrical frequency, one or more third shields with an individual third shield being employed for each spark plug forming part of the ignition system of said vehicle, each said third shield having an elongate hollow body capable of being disposed about a spark plug to retentively, but nevertheless removably hold a spark plug within said body, said elongate hollow body having a first open end and a second open end which is opposite said first open end, an internal shoulder in said body facing the second open end of the body and facing an enlarged multi-sided nut portion on the body of a spark plug, the second open end of said body having an inwardly struck flange element, and a spring means retained by said internal shoulder in said shield body and bearing against said nut portion, said first open end of said shield body permitting connection of an ignition wire to said shield body in contact with the plug.

21. The shielding system as defined in claim 20 wherein said inwardly struck flange element has an undulant and symmetrical configuration, said flange element being comprised of a plurality of circumferentially spaced projections separated by intermediate areas, so that said projections engage a surface on said nut portion in one orientation and hold said spark plug in said shield body and permit said nut portion to pass through said second opening when in another orientation.

22. The third shield as defined in claim 21 wherein said nut portion has a plurality of wrenching flats on a side thereof and said surface is a shoulder on said nut facing said first open end.

* * * * *